United States Patent [19]

Ernthausen

[11] 3,943,394

[45] Mar. 9, 1976

[54] GASEOUS DISCHARGE DISPLAY/MEMORY PANEL WITH DIELECTRIC LAYER

[75] Inventor: Roger E. Ernthausen, Luckey, Ohio

[73] Assignee: Owens-Illinois, Inc., Toledo, Ohio

[22] Filed: Oct. 12, 1973

[21] Appl. No.: 406,022

Related U.S. Application Data

[63] Continuation-in-part of Ser. No. 204,700, Dec. 3, 1971, abandoned, Continuation-in-part of Ser. No. 70,745, Sept. 8, 1970, Pat. No. 3,634,719.

[52] U.S. Cl. ............... 313/201; 313/218; 313/221; 315/169 TV
[51] Int. Cl.² ................. H01J 65/00; H01J 61/02
[58] Field of Search ........... 313/201, 210, 218, 221; 315/169 R, 169 TV

[56] References Cited
UNITED STATES PATENTS

| | | | |
|---|---|---|---|
| 3,551,721 | 12/1970 | Holz | 313/210 X |
| 3,716,424 | 2/1973 | Schoolar | 148/175 |
| 3,716,742 | 2/1973 | Nakayama et al. | 315/169 X |

*Primary Examiner*—James W. Lawrence
*Assistant Examiner*—E. R. LaRoche
*Attorney, Agent, or Firm*—Donald Keith Wedding

[57] ABSTRACT

There is disclosed a multiple gaseous discharge display/memory panel having an electrical memory and capable of producing a visual display, the panel being characterized by an ionizable gaseous medium in a gas chamber formed by a pair of opposed dielectric material charge storage members which are respectively backed by an array of conductor (electrode) members, the conductor array behind each dielectric material member being appropriately oriented with respect to the conductor array behind the opposing dielectric material member so as to define a plurality of discrete discharge volumes constituting a discharge unit, the surface of at least one dielectric material member comprising at least one inorganic non-oxide lead compound, said compound being present in an amount sufficient to improve the operating characteristics of the panel, especially more uniform and/or lower panel operating voltages. Although the invention typically comprises display/memory panels having opposed dielectric members, it is contemplated using this invention with panels having only one insulated electrode and/or only one dielectric member such as in a monolithic type device.

7 Claims, 5 Drawing Figures

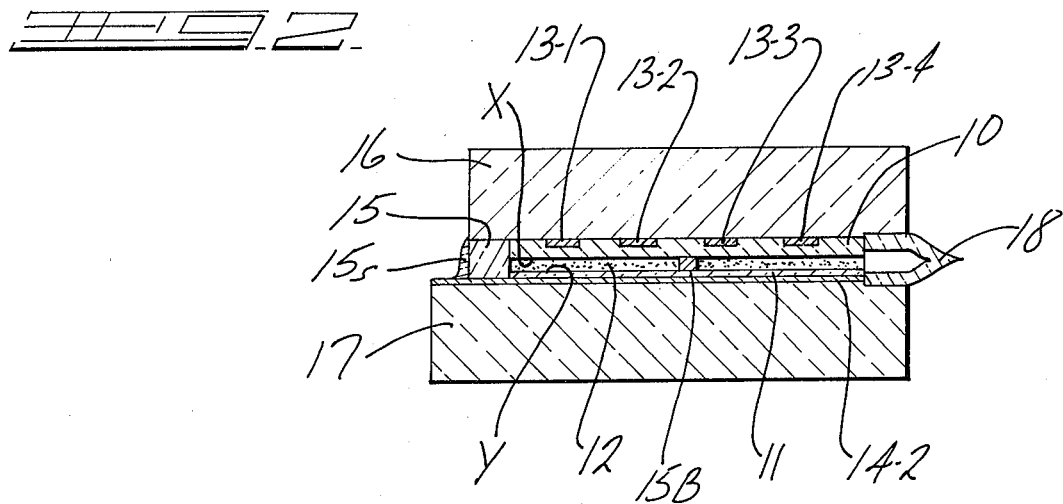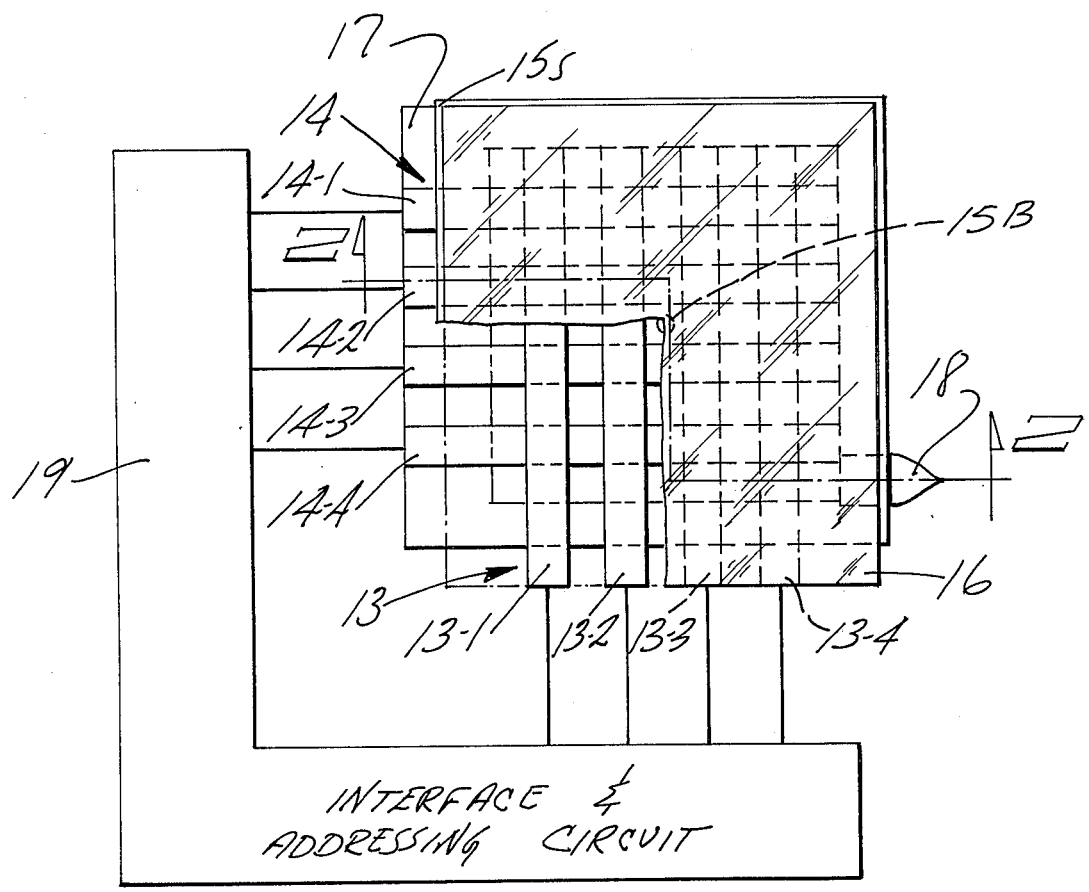

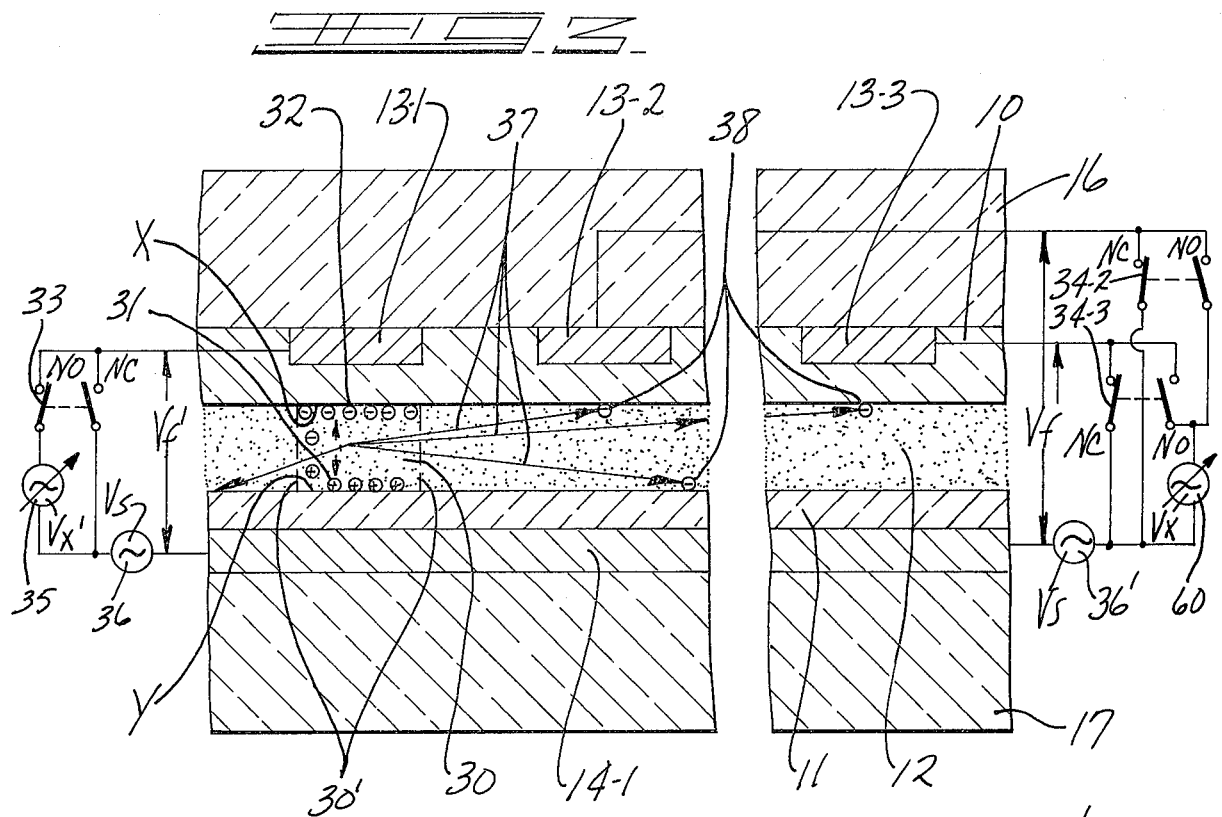
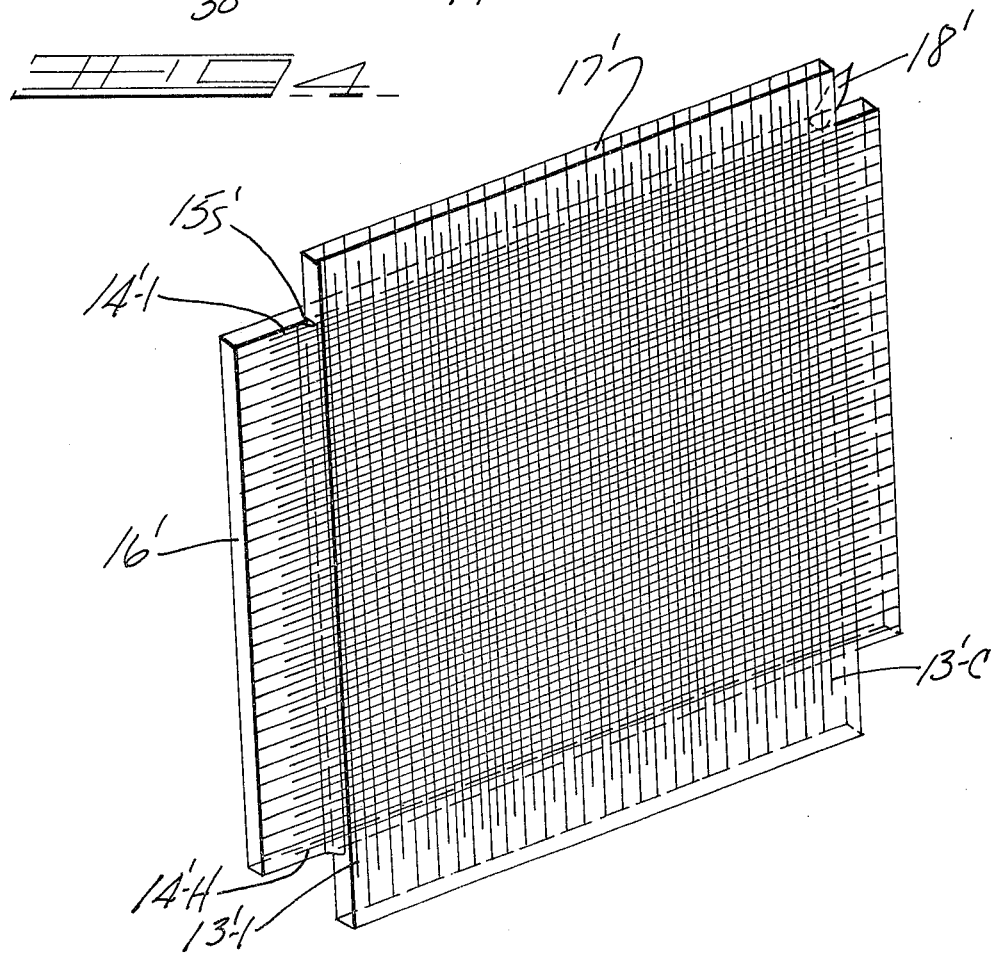

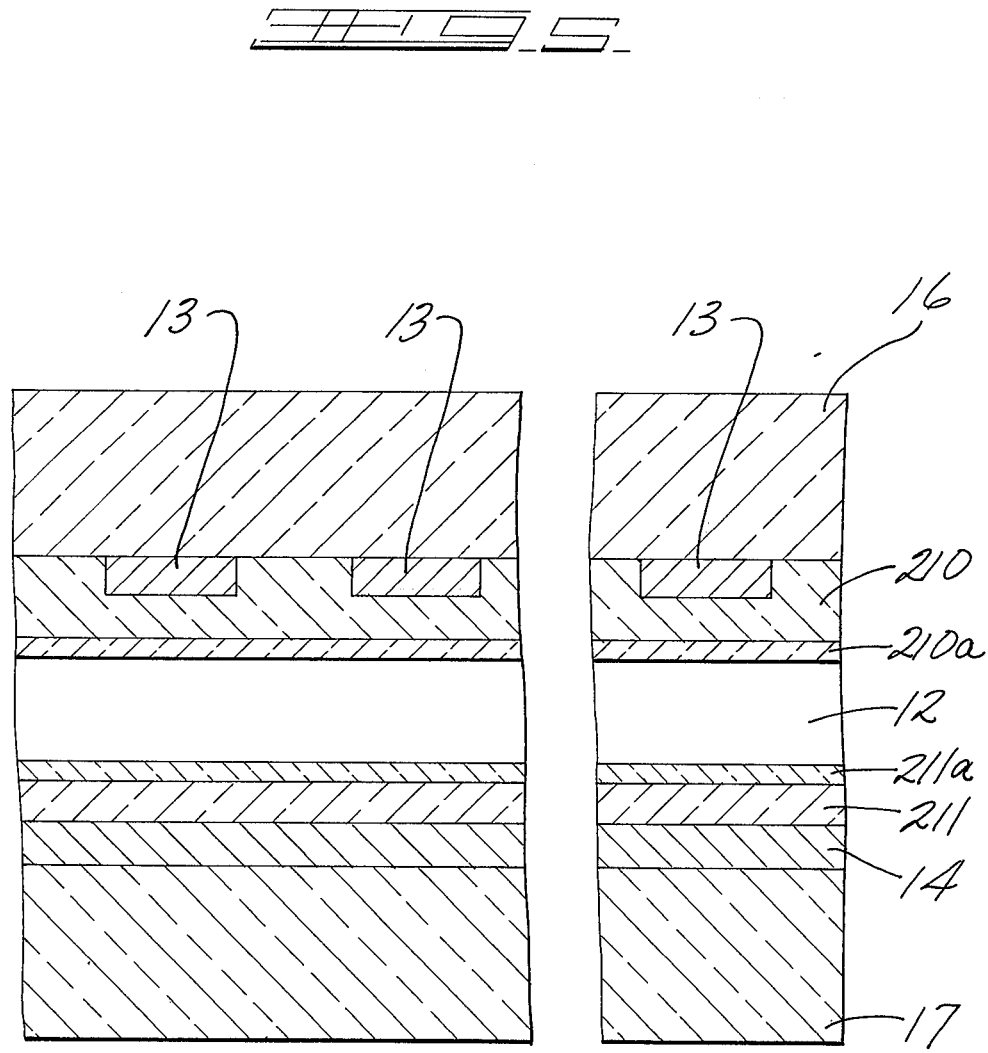

GASEOUS DISCHARGE DISPLAY/MEMORY PANEL WITH DIELECTRIC LAYER

RELATED APPLICATION

This application is a continuation-in-part of copending U.S. patent application Ser. No. 204,700 filed Dec. 3, 1971, now abandoned, which is a continuation-in-part of U.S. patent application Ser. No. 70,745, filed Sept. 8, 1970, now U.S. Pat. No. 3,634,719.

BACKGROUND OF THE INVENTION

This invention relates to novel multiple gas discharge display/memory panels or units which have an electrical memory and which are capable of producing a visual display or representation of data such as numerals, letters, television display, radar displays, binary words, etc.

Multiple gas discharge display and/or memory panels of one particular type with which the present invention is concerned are characterized by an ionizable gaseous medium, usually a mixture of at least two gases at an appropriate gas pressure, in a thin gas chamber or space between a pair of opposed dielectric charge storage members which are backed by conductor (electrode) members, the conductor members backing each dielectric member typically being appropriately oriented so as to define a plurality of discrete gas discharge units or cells.

In some prior art panels the discharge cells are additionally defined by surrounding or confining physical structure such as apertures in perforated glass plates and the like so as to be physically isolated relative to other cells. In either case, with or without the confining physical structure, charges (electrons, ions) produced upon ionization of the elemental gas volume of a selected discharge cell, when proper alternating operating potentials are applied to selected conductors thereof, are collected upon the surfaces of the dielectric at specifically defined locations and constitute an electrical field opposing the electrical field which created them so as to terminate the discharge for the remainder of the half cycle and aid in the initiation of a discharge on a succeeding opposite half cycle of applied voltage, such charges as are stored constituting an electrical memory.

Thus, the dielectric layers prevent the passage of substantial conductive current from the conductor members to the gaseous medium and also serve as collecting surfaces for ionized gaseous medium charges (electrons, ions) during the alternate half cycles of the A.C. operating potentials, such charges collecting first on one elemental or discrete dielectric surface area and then on an opposing elemental or discrete dielectric surface area on alternate half cycles to constitute an electrical memory.

An example of a panel structure containing non-physically isolated or open discharge cells is disclosed in U.S. Pat. No. 3,499,167 issued to Theodore C. Baker, et al.

An example of a panel containing physically isolated cells is disclosed in the article by D. L. Bitzer and H. G. Slottow entitled "The Plasma Display Panel — A Digitally Addressable Display With Inherent Memory", Proceeding of the Fall Joint Computer Conference, IEEE, San Francisco, Calif., November 1966, pages Calif., 541–547. Also reference is made to U.S. Pat. No. 3,559,190.

In the construction of the panel, a continuous volume of ionizable gas is confined between a pair of dielectric surfaces backed by conductor arrays typically forming matrix elements. The two conductor arrays may be orthogonally related sets of parallel lines (but any other configuration of conductor arrays may be used). The two arrays define at their intersections a plurality of opposed pairs of change storage areas on the surfaces of the dielectric bounding or confining the gas. Thus, for a conductor matrix having H rows and C columns the number of elemental or discrete areas will be twice the number of elemental discharge cells.

In addition, the panel may comprise a so-called monolithic structure in which the conductor arrays are created on a single substrate and wherein two or more arrays are separated from each other and from the gaseous medium by at least one insulating member. In such a device the gas discharge takes place not between two opposing electrodes, but between two contiguous or adjacent electrodes on the same substrate; the gas being confined between the substrate and an outer retaining wall.

It is also feasible to have a gas discharge device wherein some of the conductive or electrode members are in direct contact with the gaseous medium and the remaining electrode members are appropriately insulated from such gas, i.e., at least one insulated electrode.

In addition to the matrix configuration, the conductor arrays may be shaped otherwise. Accordingly, while the preferred conductor arrangement is of the crossed grid type as discussed herein, it is likewise apparent that where a maximal variety of two dimensional display patterns is not necessary, as where specific standardized visual shapes (e.g., numerals, letters, words, etc.) are to be formed and image resolution is not critical, the conductors may be shaped accordingly (e.g., a segmented digit display).

The gas is one which produces visible light or invisible radiation which stimulates a phosphor (if visual display is an objective) and a copious supply of charges (ions and electrons) during discharge.

In the prior art, a wide variety of gases and gas mixtures have been utilized as the gaseous medium in a number of different gas discharge devices. Typical of such gases include pure gases and mixtures of CO; $CO_2$; halogens; nitrogen; $NH_3$; oxygen, water vapor; hydrogen; hydrocarbons; $P_2O_5$; boron fluoride; acid fumes; $TiCl_4$; air; $H_2O_2$; vapors of sodium, mercury, thallium, cadmium, rubidium, and cesium; carbon disulfide; laughing gas; $H_2S$; deoxygenated air; phosphorus vapors; $C_2H_2$; $CH_4$; naphthalene vapor; anthracene; freon; ethyl alcohol; methylene bromide; heavy hydrogen; electron attaching gases; sulfur hexafluoride; tritium; radioactive gases; and the so-called rare or inert Group VIII gases.

In an open cell Baker, et al. type panel, the gas pressure and the electric field are sufficient to laterally confine charges generated on discharge within elemental or discrete dielectric areas within the perimeter of such areas, especially in a panel containing non-isolated discharge cells. As described in the Baker, et al. patent, the space between the dielectric surfaces occupied by the gas is such as to permit photons generated on discharge in a selected discrete or elemental volume of gas to pass freely through the gas space and strike surface areas of dielectric remote from the selected discrete volumes, such remote, photon struck dielectric surface areas thereby emitting electrons so as to condition at least one elemental volume other than the elemental volume in which the photons originated.

With respect to the memory function of a given discharge panel, the allowable distance or spacing between the dielectric surfaces depends, inter alia, on the frequency of the alternating current supply, the distance typically being greater for lower frequencies.

While the prior art does disclose gaseous discharge devices having externally positioned electrodes for initiating a gaseous discharge, sometimes called "electrodeless discharge", such prior art devices utilized frequencies and spacing or discharge volumes and operating pressures such that although discharges are initiated in the gaseous medium, such discharges are ineffective or not utilized for charge generation and storage at high frequencies; although charge storage may be realized at lower frequencies, such charge storage has not been utilized in a display/memory device in the manner of the Bitzer-Slottow or Baker, et al. invention.

The term "memory margin" is defined herein as $$M.M. = \frac{V_f - V_E}{V_f/2}$$

where $V_f$ is the half amplitude of the smallest sustaining voltage signal which results in a discharge every half cycle, but at which the cell is not bi-stable and $V_E$ is the half amplitude of the minimum applied voltage sufficient to sustain discharges once initiated.

It will be understood that the basic electrical phenomenon utilized in this invention is generation of charges (ions and electrons) alternately storable at pairs of opposed or facing discrete points or areas on a pair of dielectric surfaces backed by conductors connected to a source of operating potential. Such stored charges result in an electrical field opposing the field produced by the applied potential that created them and hence operate to terminate ionization in the elemental gas volume between opposed or facing discrete points or areas of dielectric surface. The term "sustain a discharge" means producing a sequence of momentary discharges, at least one discharge for each half cycle of applied alternating sustaining voltage, once the elemental gas volume has been fired, to maintain alternate storing of charges at pairs of opposed discrete areas on the dielectric surfaces.

As used herein, a cell is in the "on state" when a quantity of charge is stored in the cell such that on each half cycle of the sustaining voltage, a gaseous discharge is produced.

In addition to the sustaining voltage, other voltages may be utilized to operate the panel, such as firing, addressing, and writing voltages.

A "firing voltage" is any voltage, regardless of source, required to discharge a cell. Such voltage may be completely external in origin or may be comprised of internal cell wall voltage in combination with externally originated voltages.

An "addressing voltage" is a voltage produced on the panel X - Y electrode coordinates such that at the selected cell or cells, the total voltage applied across the cell is equal to or greater than the firing voltage whereby the cell is discharged.

A "writing voltage" is an addressing voltage of sufficient magnitude to make it probable that on subsequent sustaining voltage half cycles, the cell will be in the on state.

In the operation of a multiple gaseous discharge device, of the type described hereinbefore, it is necessary to condition the discrete elemental gas volume of each discharge cell by supplying at least one free electron thereto such that a gaseous discharge can be initiated when the cell is addressed with an appropriate voltage signal.

The prior art has disclosed and practiced various means for conditioning gaseous discharge cells.

One such means of panel conditioning comprises a so-called electronic process whereby an electronic conditioning signal or pulse is periodically applied to all of the panel discharge cells, as disclosed for example in British patent specification No. 1,161,832, page 8, lines 56 to 76. Reference is also made to U.S. Pat. 3,559,190 and "The Device Characteristics of the Plasma Display Element" by Johnson, et al., IEEE Transactions On Electron Devices, Sept., 1971. However, electronic conditioning is self-conditioning and is only effective after a discharge cell has been previously conditioned; that is, electronic conditioning involves periodically discharging a cell and is therefore a way of maintaining the presence of free electrons. Accordingly, one cannot wait too long between the periodically applied conditioning pulses since there must be at least one free electron present in order to discharge and condition a cell.

Another conditioning method comprises the use of external radiation, such as flooding part or all of the gaseous medium of the panel with ultraviolet radiation. This external conditioning method has the obvious disadvantage that it is not always convenient or possible to provide external radiation to a panel, especially if the panel is in a remote position. Likewise, an external UV source requires auxiliary equipment. Accordingly, the use of internal conditioning is generally preferred.

One internal conditioning means comprises using internal radiation, such as by the inclusion of a radioactive material.

Another means of internal conditioning, which we call photon conditioning, comprises using one or more so-called pilot discharge cells in the on-state for the generation of photons. This is particularly effective in a so-called open cell construction (as described in the Baker, et al. patent) wherein the space between the dielectric surfaces occupied by the gas is such as to permit photons generated on discharge in a selected discrete or elemental volume of gas (discharge cell) to pass freely through the panel gas space so as to condition other and more remote elemental volumes of other discharge units. In addition to or in lieu of the pilot cells, one may use other sources of photons internal to the panel.

Internal photon conditioning may be unreliable when a given discharge unit to be addressed is remote in distance relative to the conditioning source, e.g., the pilot cell. Accordingly, a multiplicity of pilot cells may be required for the conditioning of a panel having a large geometric area. In one highly convenient arrangement, the panel matrix border (perimeter) is comprised of a plurality of such pilot cells.

DRAWINGS ILLUSTRATING GAS DISCHARGE DISPLAY/MEMORY PANEL

Reference is made to the accompanying drawings and the hereinafter discussed FIGS. 1 to 4 shown thereon illustrating a gas discharge display/memory panel of the Baker, et al. type.

FIG. 1 is a partially cut-away plan view of a gaseous discharge display/memory panel as connected to a diagrammatically illustrated source of operating potentials.

FIG. 2 is a cross-sectional view (enlarged, but not to proportional scale since the thickness of the gas volume, dielectric members and conductor arrays have been enlarged for purposes of illustration) taken on lines 2—2 of FIG. 1.

FIG. 3 is an explanatory partial cross-sectional view similar to FIG. 2 (enlarged, but not to proportional scale).

FIG. 4 is an isometric view of a gaseous discharge display/memory panel.

FIG. 5 illustrates one practice of this invention utilizing a cross-sectional view as in FIG. 4.

The invention utilizes a pair of dielectric films 10 and 11 separated by a thin layer or volume of a gaseous discharge medium 12, the medium 12 producing a copious supply of charges (ions and electrons) which are alternately collectable on the surface of the dielectric members at opposed or facing elemental or discrete areas X and Y defined by the conductor matrix on non-gas-contacting sides of the dielectric members, and a plurality of pairs of elemental X and Y areas. While the electrically operative structural members such as the dielectric members 10 and 11 and conductor matrixes 13 and 14 are all relatively thin (being exaggerated in thickness in the drawings) they are formed on and supported by rigid nonconductive support members 16 and 17 respectively.

Preferably, one or both of nonconductive support members 16 and 17 pass light produced by discharge in the elemental gas volumes. Preferably, they are transparent glass members and these members essentially define the overall thickness and strength of the panel. For example, the thickness of gas layer 12 as determined by spacer 15 is usually under 10 mils and preferably about 4 to 8 mils, dielectric layers 10 and 11 (over the conductors at the elemental or discrete X and Y areas) are usually between 1 and 2 mils thick, and conductors 13 and 14 about 8,000 angstroms thick. However, support members 16 and 17 are much thicker (particularly in larger panels) so as to provide as much ruggedness as may be desired to compensate for stresses in the panel. Support members 16 and 17 also serve as heat sinks for heat generated by discharges and thus minimize the effect of temperature on operation of the device. If it is desired that only the memory function be utilized, then none of the members need be transparent to light.

Except for being nonconductive or good insulators the electrical properties of support members 16 and 17 are not critical. The main function of support members 16 and 17 is to provide mechanical support and strength for the entire panel, particularly with respect to pressure differential acting on the panel and thermal shock. As noted earlier, they should have thermal expansion characteristics substantially matching the thermal expansion characteristics of the dielectric layers 10 and 11. Ordinary ¼ inch commercial grade soda lime plate glasses have been used for this purpose. Other glasses such as low expansion glasses or devitrified glasses can be used provided they can withstand processing and have expansion characteristics substantially matching expansion characteristics of the dielectric coatings 10 and 11. For given pressure differentials and thickness of plates, the stress and deflection of plates may be determined by following standard stress and strain formulas (see R. J. Roark, *Formulas for Stress and Strain*, McGraw-Hill, 1954).

Spacer 15 may be made of the same glass material as dielectric films 10 and 11 and may be integral rib formed on one of the dielectric members and fused to the other members to form a bakeable hermetic seal enclosing and confining the ionizable gas volume 12. However, a separate final hermetic seal may be effected by a high strength devitrified glass sealant 15S. Tubulation 18 is provided for exhausting the space between dielectric members 10 and 11 and filling that space with the volume of ionizable gas. For large panels small beadlike solder glass spacers such as shown at 15B may be located between conductor intersections and fused to dielectric members 10 and 11 to aid in withstanding stress on the panel and maintain uniformity of thickness of gas volume 12.

Conductor arrays 13 and 14 may be formed on support members 16 and 17 by a number of well-known processes, such as photoetching, vacuum deposition, stencil screening, etc. In the panel shown in FIG. 4, the center-to-center spacing of conductors in the respective arrays is about 17 mils. Transparent or semi-transparent conductive material such as tin oxide, gold, or aluminum can be used to form the conductor arrays and should have a resistance less than 3000 ohms per line. Narrow opaque electrodes may alternately be used so that discharge light passes around the edges of the electrodes to the viewer. It is important to select a conductor material that is not attacked during processing by the dielectric material.

It will be appreciated that conductor arrays 13 and 14 may be wires or filaments of copper, gold, silver or aluminum or any other conductive metal or material. For example 1 mil wire filaments are commercially available and may be used in the invention. However, formed in situ conductor arrays are preferred since they may be more easily and uniformly placed on an adhered to the support plates 16 and 17.

Dielectric layer members 10 and 11 are formed of an inorganic material and are preferably formed in situ as an adherent film or coating which is not chemically or physically affected during bake-out of the panel. One such material is a solder glass such as Kimble SG-68 manufactured by and commercially available from the assignee of the present invention.

This glass has thermal expansion characteristics substantially matching the thermal expansion characteristics of certain soda-lime glasses, and can be used as the dielectric layer when the support members 16 and 17 are soda-lime glass plates. Dielectric layers 10 and 11 must be smooth and have a dielectric breakdown voltage of about 1000 v. and be electrically homogeneous on a microscopic scale (e.g., no cracks, bubbles, crystals, dirt, surface films, etc.). In addition, the surfaces of dielectric layers 10 and 11 should be good photoemitters of electrons in a baked out condition. Alternately, dielectric layers 10 and 11 may be overcoated with materials designed to produce good electron emission, as in U.S. Pat. No. 3,634,719, issued to Roger E.

Ernsthausen. Of course, for an optical display at least one of dielectric layers 10 and 11 should pass light generated on discharge and be transparent or translucent and, preferably, both layers are optically transparent.

The preferred spacing between the facing surfaces of the two dielectric films is about 4 to 8 mils with conductor arrays 13 and 14 having center-to-center spacing of about 17 mils.

The ends of conductors 14-1 . . . 14-4 and support member 17 extend beyond the enclosed gas volume 12 and are exposed for the purpose of making electrical connection to interface and addressing circuitry 19. Likewise, the ends of conductors 13-1 . . . 13-4 on support member 16 extend beyond the enclosed gas volume 12 and are exposed for the purpose of making electrical connection to interface and addressing circuitry 19.

As in known display systems, the interface and addressing circuitry or system 19 may be relatively inexpensive line scan systems or the somewhat more expensive high speed random access systems. In either case, it is to be noted that a lower amplitude of operating potentials helps to reduce problems associated with the interface circuitry between the addressing system and the display/memory panel, per se. In addition, by providing a panel having greater uniformity in discharge characteristics throughout the panel, manufacturing tolerances of the interfacing circuitry can be made less rigid.

One mode of initiating operation of the panel will be described with reference to FIG. 3, which illustrates the condition of one elemental gas volume 30 having an elemental cross-sectional area and volume which is quite small relative to the entire volume and cross-sectional area of gas 12. The cross-sectional area of volume 30 is defined by the overlapping common elemental areas of the conductor arrays and the volume is equal to the product of the distance between the dielectric surfaces and the elemental area. It is apparent that if the conductor arrays are uniform and linear and are orthogonally (at right angles to each other) related each of elemental areas X and Y will be squares and if conductors of one conductor array are wider than conductors of the other conductor arrays, said areas will be rectangles. If the conductor arrays are at transverse angles relative to each other, other than 90°, the areas will be diamond shaped so that the cross-sectional shape of each volume is determined solely in the first instance by the shape of the common area of overlap between conductors in the conductor arrays 13 and 14. The dotted lines 30' are imaginary lines to show a boundary of one elemental volume about the center of which each elemental discharge takes place. As described earlier herein, it is known that the cross-sectional area of the discharge in a gas is affected by, inter alia, the pressure of the gas, such that, if desired, the discharge may even be constricted to within an area smaller than the area of conductor overlap. By utilization of this phenomena, the light production may be confined or resolved substantially to the area of the elemental cross-sectional area defined by conductor overlap. Moreover, by operating at such pressure charges (ions and electrons) produced on discharge are laterally confined so as to not materially affect operation of adjacent elemental discharge volumes.

In the instance shown in FIG. 3, a conditioning discharge about the center of elemental volume 30 has been initiated by application to conductor 13-1 and conductor 14-1 firing potential $V_x'$ as derived from a source 35 of variable phase, for example, and source 36 of sustaining potential $V_s$ (which may be a sine wave, for example). The potential $V_x'$ is added to the sustaining potential $V_s$ as sustaining potential $V_s$ increases in magnitude to initiate the conditioning discharge about the center of elemental volume 30 shown in FIG. 3. There, the phase of the source 35 of potential $V_x'$ has been adjusted into adding relation to the alternating voltage from the source 36 of sustaining voltage $V_s$ to produce a voltage $V_f'$, when switch 33 has been closed, to conductors 13-1 and 14-1 defining elementary gas volume 30 sufficient (in time and/or magnitude) to produce a light generating discharge centered about discrete elemental gas volume 30. At the instant shown, since conductor 13-1 is positive, electrons 32 have collected on and are moving to an elemental area of dielectric member 10 substantially corresponding to the area of elemental gas volume 30 and the less mobile positive ions 31 are beginning to collect on the opposed elemental area of dielectric member 11 since it is negative. As these charges build up, they constitute a back voltage opposed to the voltage applied to conductors 13-1 and 14-1 and serve to terminate the discharge in elemental gas volume 30 for the remainder of half cycle.

During the discharge about the center of elemental gas volume 30, photons are produced which are free to move or pass through gas medium 12, as indicated by arrows 37, to strike or impact remote surface areas of photoemissive dielectric members 10 and 11, causing such remote areas to release electrons 38. Electrons 38 are, in effect, free electrons in gas medium 12 and condition each other discrete elemental gas volume for operation at a firing potential $V_f$ which is lower in magnitude than the firing potential $V_f'$ for the initial discharge about the center of elemental volume 30 and this voltage is substantially uniform for each other elemental gas volume.

Thus, elimination of physical obstructions or barriers between discrete elemental volumes, permits photons to travel via the space occupied by the gas medium 12 to impact remote surface areas of dielectric members 10 and 11 and provides a mechanism for supplying free electrons to all elemental gas volumes, thereby conditioning all discrete elemental gas volumes for subsequent discharges, respectively, at a substantially uniform lower applied potential. While in FIG. 3 a single elemental volume 30 is shown, it will be appreciated that an entire row (or column) of elemental gas volumes may be maintained in a "fired" condition during normal operation of the device with the light produced thereby being masked or blocked off from the normal viewing area and not used for display purposes. It can be expected that in some applications there will always be at least one elemental volume in a fired condition and producing light in a panel, and in such applications it is not necessary to provide separate discharge or generation of photons for purposes described earlier.

However, as described earlier, the entire gas volume can be conditioned for operation at uniform firing potentials by use of external or internal radiation so that there will be not need for a separate source of higher potential for initiating an initial discharge. Thus, by irradiating the panel with ultraviolet radiation or by including a radioactive material within the glass materials or gas space, all discharge volumes can be operated at uniform potentials from addressing and interface circuit 19.

Since each discharge is terminated upon a build-up or storage of charges at opposed pairs of elemental areas, the light produced is likewise terminated. In fact, light production lasts for only a small fraction of a half cycle of applied alternating potential and, depending on design parameters, is typically in the submicrosecond range.

After the initial firing or discharge of discrete elemental gas volume 30 by a firing potential $V_f'$, switch 33 may be opened so that only the sustaining voltage $V_s$ from source 36 is applied to conductors 13-1 and 14-1. Due to the storage of charges (e.g., the memory) at the opposed elemental areas X and Y, the elemental gas volume 30 will discharge again at or near the peak of negative half cycles of sustaining voltage $V_s$ to again produce a momentary pulse of light. At this time, due to reversal of field direction, electrons 32 will collect on and be stored on elemental surface area Y of dielectric member 11 and positive ions 31 will collect and be stored on elemental surface area X of dielectric member 10. After a few cycles of sustaining voltage $V_s$, the times of discharge become symmetrically located with respect to the wave form of sustaining voltage $V_s$. At remote elemental volumes, as for example, the elemental volumes defined by conductor 14-1 which conductors 13-2 and 13-3, a uniform magnitude or potential $V_x$ from source 60 is selectively added by one or both of switches 34-2 or 34-3 to the sustaining voltage $V_s$, shown as 36', to fire one or both of these elemental discharge volumes. Due to the presence of free electrons produced as a result of the discharge centered about elemental volume 30, each of these remote discrete elemental volumes have been conditioned for operation at uniform firing potential $V_f$.

In order to turn "off" an elemental gas volume (i.e., terminate a sequence of discharges representing the "on" state), the sustaining voltage may be removed. However, since this would also turn off other elemental volumes along a row or column, it is preferred that the volumes be selectively turned off by application to selected on elemental volumes a voltage which can neutralize the charges stored at the pairs of opposed elemental areas.

This can be accomplished in a number of ways, as for example, varying the phase or time position of the potential from source 60 to where that voltage combined with the potential from source 36' falls substantially below the sustaining voltage.

It is apparent that the plates 16–17 need not be flat but may be curved, curvature of facing surfaces of each plate being complementary to each other. While the preferred conductor arrangement is of the crossed grid type as shown herein, it is likewise apparent that where an infinite variety of two dimensional display patterns are not necessary, as where specific standardized visual shapes (e.g., numerals, letters, words, etc.) are to be formed and image resolution is not critical, the conductors may be shaped accordingly. Reference is made to British patent specification No. 1,302,148 and U.S. Pat. No. 3,711,733 wherein non-grid electrode arrangements are illustrated.

The device shown in FIG. 4 is a panel having a large number of elemental volumes similar to elemental volume 30 (FIG. 3). In this case more room is provided to make electrical connection to the conductor arrays 13' and 14', respectively, by extending the surfaces of support members 16' and 17' beyond seal 15S', alternate conductors being extended on alternate sides. Conductor arrays 13' and 14' as well as support members 16' and 17' are transparent. The dielectric coatings are not shown in FIG. 4 but are likewise transparent so that the panel may be viewed from either side.

THE INVENTION

In accordance with this invention, the operating characteristics of a gaseous discharge display/memory panel are enhanced and improved by applying to at least one dielectric surface a beneficial amount of at least one inorganic non-oxide lead compound.

The inorganic non-oxide lead compound is applied to the dielectric surface as a continuous or discontinuous layer.

As used herein, the term "layer" is intended to be all inclusive of other similar terms such as film, deposit, coating, finish, spread, covering, etc.

The inorganic compound is applied to the dielectric surface (or over a previously applied dielectric layer) by any convenient means including not by way of limitation vapor deposition; vacuum deposition; chemical vapor deposition; wet spraying upon the surface a mixture or solution of the layer substance suspended or dissolved in a liquid followed by evaporation of the liquid; dry spraying of the layer upon the surface; thermal evaporation using direct heat, electron beam, or laser; plasma flame and/or arc spraying and/or deposition; and sputtering target techniques.

In one embodiment hereof, a layer of the inorganic non-oxide lead compound is applied to the dielectric surface, such as by one of the foregoing methods, especially electron beam evaporation.

Although the inorganic non-oxide lead compound is typically applied on the charge storage side of the dielectric member, it is contemplated that such may be applied to a non-charge storage side, such as on the electrode array side of a dielectric.

Typical inorganic non-oxide compounds include: lead azide; lead borofluoride; lead bromide; lead carbonate; lead chlorate; lead chloride; lead sulfide-chloride; lead chlorite; lead cyanate; lead cyanide; lead fluoride; lead fluorochloride; lead iodate; lead basic iodide; lead diiodide; lead monoiodide; lead nitrate; lead oxychloride; lead metaphosphate; lead orthophosphate; lead pyrophosphate; lead selenide; lead sulfate; lead basic sulfate; lead sulfide; lead sulfite; lead thiosulfate; lead telluride; and lead thiocyanate.

One or more layers of other substances may be used in combination with the inorganic compounds of this invention, especially compounds of lead, aluminum, titanium, silicon, zirconium, hafnium, Group IIA, rare earths, cesium, and phosphor materials. Typically such substances will be oxides. However, non-oxides are contemplated. Such layers may be applied to the dielectric before and/or after the inorganic lead compounds of this invention.

Each layer, including the layer of this invention, is applied to the dielectric, as a surface or sub-layer, in an amount sufficient to obtain the desired beneficial result, usually to a thickness of at least about 100 angstrom units with a range of about 200 angstrom units per layer up to about 1 micron (10,000 angstrom units) per layer.

In the fabrication of a gaseous discharge panel, the dielectric material is typically applied to and cured on the surface of a supporting glass substrate or base to which the electrode or conductor elements have been previously applied. The glass substrate may be of any suitable composition such as a soda lime glass composition. Two glass substrates containing electrodes and cured dielectric are then appropriately sealed together, e.g., using thermal means, so as to form a panel.

In one preferred practice of this invention, the lead compound layer, and any other layer, is applied to the surface of the cured dielectric before the panel heat sealing cycle, with the substrate temperature during applicationg ranging from about 150° to about 600° F.

The use of the inorganic lead compound layer in accordance with this invention, has many potential beneficial results. In one particular practice, the gaseous discharge panel voltage uniformity or stability as a function of panel operating time may be significantly improved and enhanced. Likewise, the required panel aging time cycle may be reduced.

In FIG. 5 there is illustrated substrates 16 and 17, electrodes 13 and 14, dielectric members 210 and 211, gaseous medium 12, and dielectric overcoats 210a and 211a.

Although not illustrated in FIG. 5, additional dielectric overcoats or undercoats of other selected materials may be used.

I claim:

1. In a gaseous discharge display/memory device characterized by an ionizable gaseous medium in a gas chamber formed by a pair of opposed dielectric material charge storage members having surfaces in contact with the gaseous medium and at least one electrode insulated from the gaseous medium by a dielectric member, the improvement wherein each dielectric surface is at least partially coated with a layer of at least one inorganic non-lead oxide lead compound, said compound being present in an amount sufficient to improve the operating characteristics of the device by substantially decreasing preliminary aging and providing stable operating voltages for a given period of operating time.

2. The invention of claim 1 wherein each dielectric surface is at least partially coated with the lead compound to a layer thickness of at least about 100 angstrom units.

3. The invention of claim 2 wherein the layer thickness ranges from about 200 angstrom units up to about 10,000 angstrom units.

4. In a gaseous discharge display/memory device comprising an ionizable gaseous medium in a gas chamber formed by a pair of opposed dielectric material charge storage members having surfaces in contact with the gaseous medium backed by electrode members which are insulated from the gaseous medium by said dielectric members, the electrode members behind each dielectric material surface being oriented with respect to the electrode members behind the opposing dielectric material surface so as to define a plurality of discharge units, the improvement wherein at least one inorganic non-lead oxide lead compound is applied to each opposed dielectric material surface in an amount sufficient to substantially decrease preliminary aging and to provide stable operating voltages for a given period of operating time.

5. As an article of manufacture, a dielectric material body having a structural configuration for use in a gaseous discharge display/memory device, said dielectric body having at least one electrode on one side thereof and on the opposite side thereof containing a surface deposit of at least one inorganic non-lead oxide lead compound, said compound being deposited in an amount sufficient to provide operating voltages when said dielectric material body is used in said device which do not substantially change over a given period of operating time.

6. The invention of claim 5 wherein the dielectric body is coated with the compound to a thickness of at least about 100 angstrom units.

7. The invention of claim 6 wherein the compound thickness ranges from about 200 angstrom units up to about 10,000 angstrom units.

* * * * *